United States Patent
Manohar et al.

(10) Patent No.: US 7,739,628 B2
(45) Date of Patent: Jun. 15, 2010

(54) SYNCHRONOUS TO ASYNCHRONOUS LOGIC CONVERSION

(75) Inventors: Rajit Manohar, Ithaca, NY (US);
Gregor Martin, San Jose, CA (US);
John Lofton Holt, Ithaca, NY (US)

(73) Assignee: Achronix Semiconductor Corporation, San Jose, CA (US)

( * ) Notice: Subject to any disclaimer, the term of this patent is extended or adjusted under 35 U.S.C. 154(b) by 292 days.

(21) Appl. No.: 12/031,992

(22) Filed: Feb. 15, 2008

(65) Prior Publication Data
US 2009/0210847 A1 Aug. 20, 2009

(51) Int. Cl.
*G06F 17/50* (2006.01)
(52) U.S. Cl. .................... 716/3; 716/6; 716/17
(58) Field of Classification Search ............... None
See application file for complete search history.

(56) References Cited

U.S. PATENT DOCUMENTS

| | | | | |
|---|---|---|---|---|
| 7,464,361 | B2 * | 12/2008 | Sandbote | 716/18 |
| 7,584,449 | B2 * | 9/2009 | Beerel et al. | 716/18 |
| 7,610,567 | B2 * | 10/2009 | Manohar | 716/3 |
| 7,614,029 | B2 * | 11/2009 | Manohar | 716/16 |
| 2005/0160392 | A1 | 7/2005 | Sandbote | |

OTHER PUBLICATIONS

M. Amde et al., "Automating the Design of an Asynchronous DLX Microprocessor," 2003 Design Automation Conference, pp. 502-507.*

I. Blunno et al., "Handshake protocols for de-synchronization," Proc. of the 10$^{th}$ Int'l Symposium on Asynchronous Circuits and Systems, 2004, 10 pages.*

A. Branover et al., "Asynchronous Design by Conversion: Converting Synchronous Circuits into Asynchronous Ones," Proc. of the Design, Automation and Test in Europe Conference and Exhibition, 2004, pp. 1-6.*

E. Mercer et al., "Stochastic Cycle Period Analysis in Timed Circuits," ISCAS 2000—IEEE Int'l Symposium on Circuits and Systems, pp. 172-175.*

"International Application Serial No. PCT/US2009/033332, International Search Report and Written Opinion mailed Apr. 28, 2009", 10 pgs.

Aimini, et al., "Globally Asynchronous lacally synchronous Wrapper Circuit based on clock gating", *Proceedings of the 2006emerging VLSI Technologies and architecture*, (Mar. 2-3, 2006), 7 pages.

Cordetella, et al., "Desynchronisation :Synthesis of Asynchronous circuits from synchronous specifications", *IEEE Transaction on computer aided desing of integrated circuits and systems* .vol. 25 No. 10, (Oct. 2006), pp. 1904-1921.

(Continued)

*Primary Examiner*—Leigh Marie Garbowski
(74) *Attorney, Agent, or Firm*—Schwegman, Lundberg & Woessner, P.A.

(57) ABSTRACT

Apparatus, systems, and methods may operate to generate a synchronous netlist from a synchronous circuit design representation, automatically substitute asynchronous components taken from an asynchronous standard cell component library for corresponding standard cell synchronous components in the synchronous netlist to form an asynchronous core, and convert the synchronous netlist to an asynchronous circuit design representation. Additional apparatus, systems, and methods are disclosed.

23 Claims, 5 Drawing Sheets

OTHER PUBLICATIONS

Oberg, et al., "Automatic synthesis of asynchronous circuits from synchronous RTL discriptions 2005", *23rd NORCHIP conference*, (Nov. 1005), 21-22, 7 pages.

Smirnov, et al., "Synthesizing asynchronous micropipelines with desing compiler", *synopsys user groups ,boston*, (2006), pp. 1-35.

* cited by examiner

SYNCHRONOUS TO ASYNCHRONOUS LOGIC CONVERSION

BACKGROUND

In many cases, asynchronous circuit designs offer various advantages over synchronous designs, including performance and power benefits. However, to implement a device based on asynchronous logic, a large amount of time, experience, and dedicated asynchronous tools may be required. For this and other reasons, existing Application Specific Integrated Circuit (ASIC) devices are designed using primarily synchronous circuits and techniques.

DETAILED DESCRIPTION

Some of the challenges described above, as well as others, may be addressed by apparatus, systems, and methods that operate to automatically synthesize synchronous logic that has been described by a hardware description language (HDL), or any high-level behavioral logic description, using automated substitution and a library of asynchronous standard cell components. This mechanism, described herein, can provide many of the benefits available to asynchronous designers, without the difficulties sometimes encountered when asynchronous designs are implemented from first principles.

Existing standard cell ASICs employ pre-designed circuit elements called a "cell," "standard cell," or "logic cell." Typically, a standard cell library includes a large collection of these synchronous cells, such as registers and flops, as well as asynchronous-combinatorial logic elements, such as AND gates, OR gates, XOR gates, inverters, etc. For clarity, it should be noted that such asynchronous-combinatorial circuit elements are distinctly different that the asynchronous circuit elements that this disclosure describes. Asynchronous-combinatorial circuit elements are simply combinatorial logic elements operating on standard binary logic as used by most existing digital circuits. Asynchronous circuit elements, on the other hand, replicate the functionality of both asynchronous-combinatorial logic elements and synchronous logic elements, but do not pass data information in the standard clocked binary format of existing synchronous standard cell circuit implementations.

Figure 1:
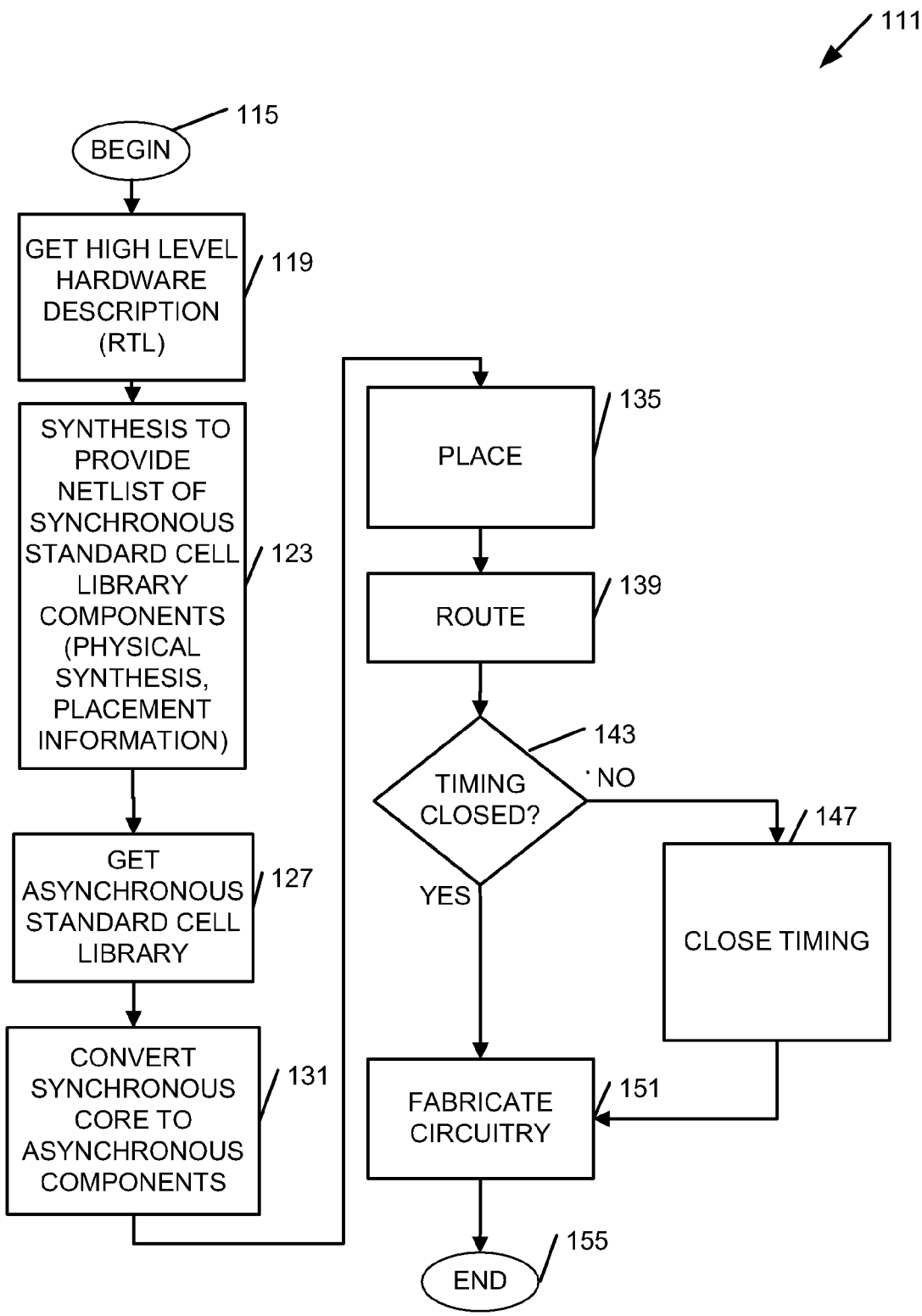
FIG. 1 is a flow diagram illustrating the conversion of synchronous logic to asynchronous logic according to various embodiments of the invention.

FIG. 1 is a flow diagram illustrating the conversion of synchronous logic to asynchronous logic according to various embodiments of the invention. These conversion methods 111 can be implemented by storing instructions in a machine-accessible and readable medium. The methods 111 are operational over processes within and among networks, which may be wired, wireless, or a combination of wired and wireless. The methods 111 may be implemented as instructions, which when executed by a machine, perform the processing depicted in FIG. 1. Given this context, the conversion of synchronous logic to asynchronous logic using automated component substitution is now discussed with reference to FIG. 1.

In some embodiments, logical synthesis is used to provide an asynchronous design. In others, physical synthesis is used. In still others, a combination of logical and physical synthesis are used.

A method 111 of synthesizing an asynchronous design from a synchronous design may begin at block 115 and continue on to block 119 with obtaining a high-level hardware description, perhaps one that makes use of a Register Transfer Level (RTL) description.

Libraries of synchronous standard cell library elements exist, each having many standard cell elements, which when connected, implement a logic circuit that exhibits a certain desired functionality. As a simplified example, consider one such library having four parts: combinatorial logic including an AND gate, an OR gate, and an inverter, as well as sequential logic including a positive-edge triggered flop. Each combinatorial cell performs a logical operation on its input(s) to produce a combinatorial output. The sequential output of the flop is a function of the data input and the clock input. The flop may be called a "register" since it operates to register the data input value between the occurrence of successive clock input signal edges. The functions available in this example synchronous component library can be seen in Tables I, II, III, and IV:

TABLE I

| AND GATE | | |
|---|---|---|
| INA | INB | OUTQ |
| 0 | 0 | 0 |
| 0 | 1 | 0 |
| 1 | 0 | 0 |
| 1 | 1 | 1 |

Description: output OUTQ is asserted if both inputs INA and INB are asserted

TABLE II

| OR GATE | | |
|---|---|---|
| INA | INB | OUTQ |
| 0 | 0 | 0 |
| 0 | 1 | 1 |
| 1 | 0 | 1 |
| 1 | 1 | 1 |

Description: output OUTQ is asserted if at least one of inputs INA or INB are asserted

TABLE III

| INVERTER | |
|---|---|
| INA | OUTQ |
| 0 | 1 |
| 1 | 0 |

Description: output OUTQ is the inverse of input INA

TABLE IV

SEQUENTIAL FLOP

| INA | CLKIN | OUTS |
|-----|-------|------|
| 0 | ↑ | 0 |
| 1 | ↑ | 1 |
| X | ↓ | same as the prior value |

Description: output OUTS takes the value of input INA at the rising edge of the CLKIN input signal Using the standard cell components in the library (typically many more than shown in this limited example), the method 111 may continue on to block 123 with synthesizing the functional circuit description to provide a netlist of synchronous standard cell library components. This can be accomplished using synthesis tools well known to those of ordinary skill in the art, that operate to interpret a description of hardware that has been defined in a Hardware Definition Language (HDL), such as a RTL description using the Verilog® or VHDL (Very High Speed Integrated Circuit HDL) languages.

The synthesis activity of block 123 may be conducted with the idea of optimizing the result for the eventual substitution of asynchronous library components. However, this depends on the particular embodiment that is to be implemented. The activity of block 123 may comprise logical synthesis, physical synthesis, or a combination of these. Thus, placement information may be acquired at this point.

The method 111 may continue on to block 127, with obtaining asynchronous standard-cell library components that can be automatically substituted for the synchronous library components that result from the synthesis activity of block 123.

At block 131, in sequential order, or in some embodiments, substantially simultaneously, the asynchronous standard-cell library components are substituted for the synchronous standard cell library components, and the synchronous netlist description is converted into an asynchronous netlist description. At this time, the asynchronous standard-cell descriptions can be changed to fully asynchronous (dataflow based) descriptions. The asynchronous logic may then be surrounded with a boundary circuit or frame so that the external inputs and outputs of the resulting circuit behave as in the original synchronous logic design.

One way to implement the dataflow model is to use dual-rail encoding with data and acknowledge. Of course, those of ordinary skill in the art will realize that there are many other handshake protocols (e.g., single-rail, dual-phase, etc.) that can be used to implement asynchronous circuit dataflow communications. The various embodiments may operate to include any and all such mechanisms.

The method 111 may continue with placement at block 135, and routing at block 139, well-known to those of ordinary skill in the art. Either of these activities may be optimized for asynchronous implementation.

If timing closure has not been accomplished, as determined at block 143, the method 111 may include closing the timing at block 147. Thereafter, or if timing has already been closed, the method 111 may include fabricating circuitry according to the asynchronous design at block 151.

After reading and understanding this disclosure, one of ordinary skill in the art will understand that for each combinational logic element in the synchronous standard cell library, an equivalent asynchronous standard cell element exists, or can be created. Each element in the asynchronous standard cell library can be implemented using a variety of asynchronous logic circuits, including quasi delay-insensitive, timed, self-timed, and other asynchronous logic family types. Elements in the asynchronous library are designed to compute the same function as the corresponding combinational logic element from the synchronous library. Examples of such combinational logic elements include lookup-tables, AOI (and-or-invert) gates, etc.

Figure 2:
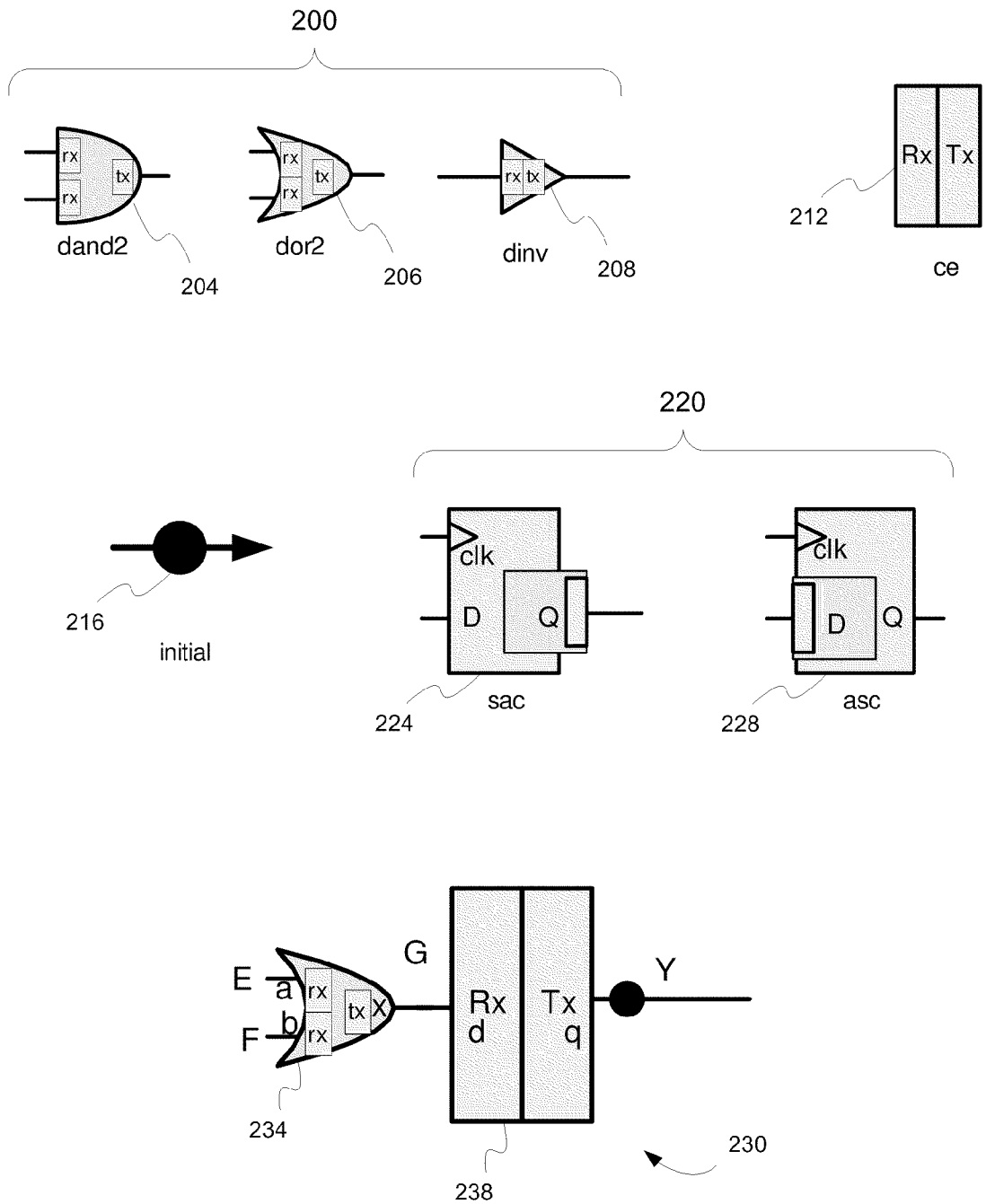
FIG. 2 is a block diagram illustrating asynchronous combinatorial and sequential logic, according to various embodiments of the invention.

FIG. 2 is a block diagram illustrating asynchronous combinatorial 200 and sequential logic 212, according to various embodiments of the invention. For example, consider a simplified asynchronous standard cell library comprising asynchronous combinatorial 200 and sequential logic 212. Each combinatorial cell 204 (e.g., asynchronous AND component), 206 (e.g., asynchronous OR component), and 208 (e.g., asynchronous inverter component) performs a logical operation on its input(s) to produce an output. The asynchronous Connection Element (CE) cell 212 is capable of storing a state, but is not required to do so. These cells function in the same logical way as their synchronous components with respect to the table functions shown in Tables I, II, III, and IV.

While logical functionality remains the same, differences in overall function arise due to the implementation of asynchronous logic elements as dataflow building blocks, which operate by waiting for valid inputs before producing valid outputs. Therefore, the dataflow AND gate 204 waits for valid inputs to arrive on its inputs before computing the AND function and producing an appropriate valid output. Therefore, while the function being computed is the same in the synchronous and asynchronous cell implementations, the operation differs because the asynchronous implementation waits for all the inputs to be valid before a valid output is produced, as opposed to the synchronous implementation which continuously computes its output. The CE cell is slightly different: the output takes the value of the data input whenever the previous output has been accepted by the next asynchronous pipeline stage.

An initial token element 216 can be used in the asynchronous standard cell library to hold an initial data value. The initial token element 216 is used to add the functional equivalence of a sequential element to circuits. Wherever a sequential element (e.g., register) exists in the original, synchronous RTL, for example, it can be replaced with an initial token element 216. In the original synchronous design, this may have been implemented using a positive edge-triggered flop, for example. Following the conversion described herein, an initial token can be added to a CE cell 212, creating behavioral equivalence to the original synchronous flop cell.

In most embodiments, input and output conversion elements 220 that convert synchronous logic data values into asynchronous tokens, and vice versa, are also part of the asynchronous standard cell library. Typically, a synchronous wrapper surrounds the asynchronous core. Thus, each signal entering the resulting asynchronous core design from the synchronous wrapper passes through a synchronous to asynchronous conversion (SAC) cell 224. Similarly, each signal leaving the asynchronous core to pass into the synchronous wrapper passes enters an asynchronous to synchronous conversion (ASC) cell 228.

As an example of using synthesis tools known to those of ordinary skill in the art, in conjunction with the methods described herein, one may refer to FIG. 1 and consider the RTL description (see block 119 of FIG. 1) of a synchronous circuit having the following behavior:

```
assign G = E | F;
always @ (posedge clock)
   begin
      Y <= G;
   end
```

The synthesis tool can interpret the design so described to synthesize a netlist which connects standard cell library elements (e.g., a synchronous OR gate and a flop) together to form a circuit that exhibits the required logic behavior (see block 123 of FIG. 1). For this particular description, the netlist output from a synthesis tool might look something like:

```
or(.a(E),.b(F),.x(G))
posflop(.d(G),.clock(CLK).q(Y))
``` which describes a two-input (e.g., inputs E and F) OR gate having an output (G) that feeds into the data input of a positive edge-triggered flop that receives the clock signal CLK and provides an output signal (Y).

This netlist output description can in turn be converted into an asynchronous representation (see block 131 of FIG. 1) similar to:

```
dor(.a(E),.b(F),.c(G))
ce(.d(G),.q(Y))
initial(Y)
``` which, as can be seen in FIG. 2, describes an asynchronous OR cell component 234 having inputs E and F, and an output G that feeds into a CE cell component 238, with an initial token value of Y. The complete asynchronous implementation of the original synchronous circuit is therefore shown as asynchronous core circuit 230.

Readers that wish to learn more about converting a synchronous netlist to an asynchronous design representation (without automatic substitution) are encouraged to consult U.S. Pat. Publication No. 2007/0256038, now U.S. Pat. No. 7,610,567, titled "Systems and Methods for Performing Automated Conversion of Representations of Synchronous Circuit Designs to and From Representations of Asynchronous Circuit Designs," assigned to the assignee of the instant disclosure, and incorporated herein by reference in its entirety.

The presence of multiple clock domains only slightly complicates matters. The only issues arise at the interface between two state-holding elements from different clock domains. We assume that the clock cycle times are rational multiples of each other. If that is indeed the case, then we can statically unroll the computation to find a repeating period that corresponds to the least common multiple of all the cycle times in the computation.

Figure 3:
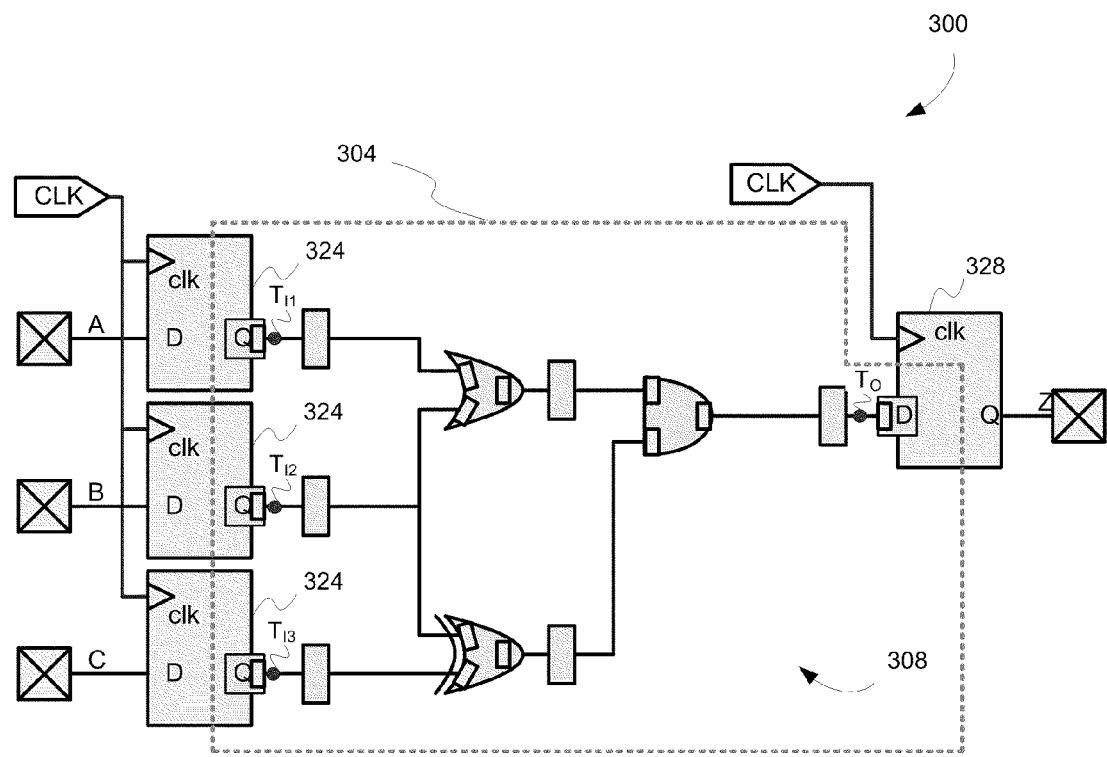
FIG. 3 is a block diagram of a synchronous wrapper surrounding asynchronous logic according to various embodiments of the invention.

FIG. 3 is a block diagram of a synchronous wrapper 304 surrounding asynchronous logic according to various embodiments of the invention. In this asynchronous implementation 300 of a synchronous design, the conversion cells 324,328 (which may be similar to or identical to the cells 224,228 of FIG.2)are used to facilitate communications between the synchronous wrapper 304 and the asynchronous core 308.For each input cycle of the clock signal CLK,every SAC cell 324 will produce a single token $T_{11}$, $T_{12}$, $T_{13}$, which flows into the asynchronous core 308. For each output cycle of the clock signal CLK, the ASC cell 328 will consume a token $T_0$ and propagate the equivalent data value to its output Q. The conservation of data value (or tokens) at the asynchronous boundary marked by the synchronous wrapper 304 ensures that the asynchronous implementation 300 of a synchronous circuit will have the same behavior as the original synchronous design.

There are numerous possible variations embodiments that may be implemented. These embodiments include optimizations of the asynchronous standard cell library to contain customized elements that are better suited to synthesis, multiple instances of the same library components so that a designer is given a choice in terms of optimization of different design metrics (e.g., area, power, and/or performance), and "fused" library elements, which have an initial token element added to other logic to optimize the implementation of the final circuit.

Figure 4:
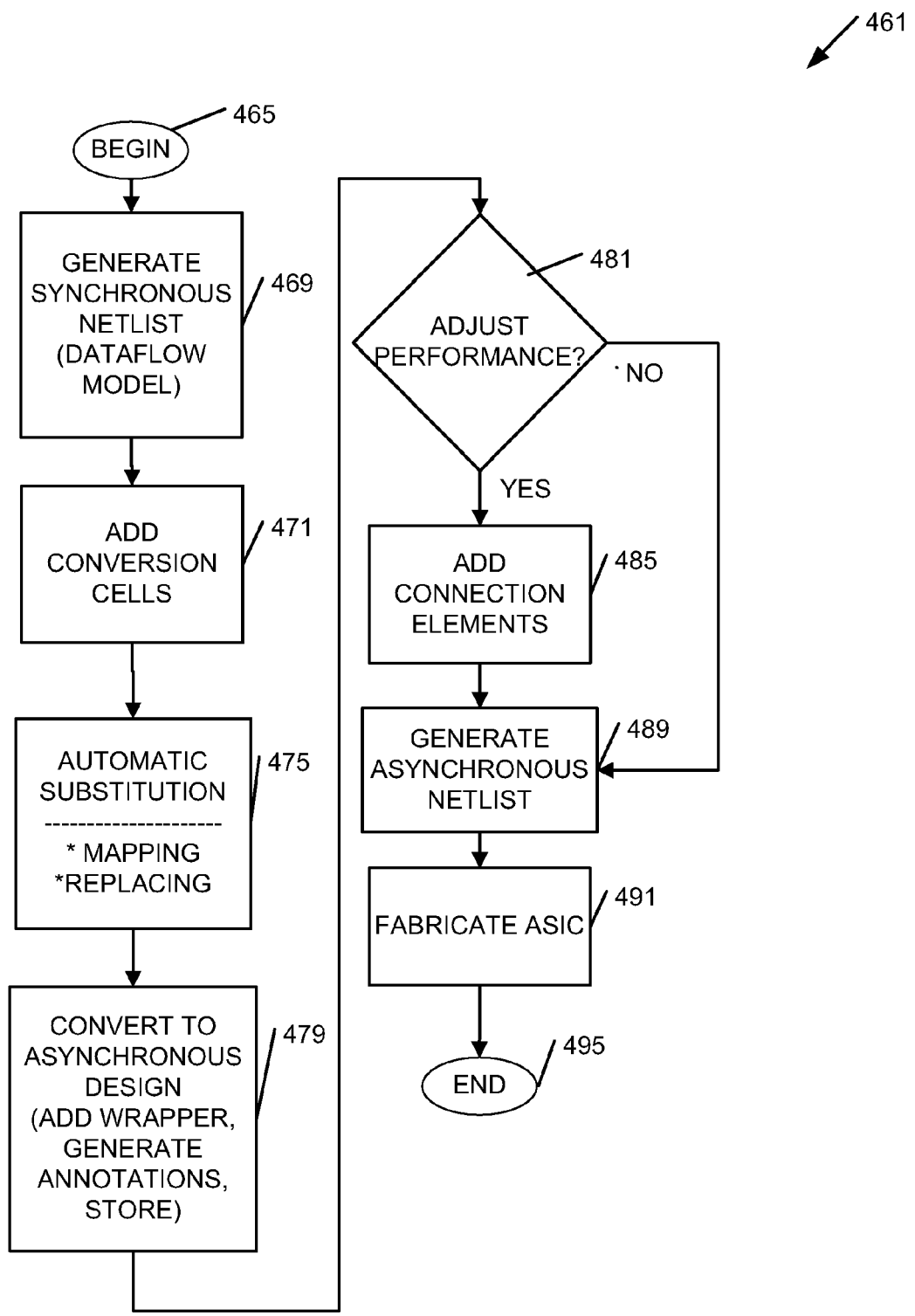
FIG. 4 is a flow diagram illustrating methods of converting synchronous logic to asynchronous logic according to various embodiments of the invention.

FIG. 4 is a flow diagram illustrating methods 461 of converting synchronous logic to asynchronous logic according to various embodiments of the invention. The methods 461 can also be implemented in a machine-accessible and readable medium, and are operational over processes within and among networks. The networks may be wired, wireless, or a combination of wired and wireless. The methods 461 may be implemented as instructions, which when accessed by a machine, perform the processing depicted in FIG. 4.

A computer-implemented method 461 of converting at least a portion of a synchronous circuit design to an asynchronous design using automatic substitution of standard cell elements may begin at block 465 and continue on to block 469 with generating a synchronous netlist from a synchronous circuit design representation. The synchronous netlist can be formatted according to an electronic design interface format (EDIF), for example.

In most embodiments, the method 461 includes, at block 471, adding SAC cells to the synchronous netlist, the SAC cells to receive signals entering the asynchronous core. Similarly, the activity of block 471 may include adding ASC cells to the synchronous netlist, the ASC cells to transmit signals leaving the asynchronous core.

The method 461 may go on to block 475 to include automatically substituting asynchronous components taken from an asynchronous standard cell component library for corresponding standard cell synchronous components in the synchronous netlist to form an asynchronous core. Automatically substituting in block 475 may include mapping pin connections of the asynchronous components to pin connections of the standard cell synchronous components.

Automatically substituting in block 475 may also comprise replacing a state-holding element comprising one of the standard cell synchronous components with one of a communication link or an initial token element. For example, automatically substituting in block 475 may comprise replacing a register included as one of the standard cell synchronous components with an initial token element associated with a connection element. It should be noted that the initial token element can be placed anywhere, not just on the connection element. In some embodiments, the initial token element is coupled directly to the connection element. However, in some ASIC implementations it may be advantageous to add the initial token elsewhere.

The method 461 may go on to include, at block 479, converting the synchronous netlist to an asynchronous circuit design representation. In some embodiments, the synchronous circuit design representation is expressed using a hardware description language. Any high-level behavioral language may be used, including those that implement the description using RTL, or those that translate the description directly to the gate level.

Therefore, the activity of blocks 469 to 479 may include going from a high level description (which may or may not imply synchronous design intent) to an asynchronous, dataflow-based circuit implementation. The asynchronous circuit design representation may comprise any one or more of a data flow graph, a description of a dataflow graph, or a high-level language. The dataflow graph may include one or more tokens to represent data, a function block, a source block, a sink block, a copy block, a merge block, and/or an initial block. Thus, the activity of block 479 may include, for example, expressing the asynchronous circuit design representation as a data flow model implemented using a variety of communication mechanisms, such as single-rail coding, dual-rail coding, and dual-rail data encoding with a single acknowledge, among others.

As part of the various embodiments described herein, converting a synthesized RTL or high-level description of the synchronous logic computation into a dataflow asynchronous computation can include converting some (or all) combinational logic elements in the synchronous logic circuit into the corresponding elements in the asynchronous standard cell library, and replacing one or more state-holding elements in the synchronous logic circuit with either a communication link or an initial token element from the asynchronous standard-cell library. Whether an initial token element or a communication link is used depends on the type of state-holding element being converted.

The new circuit representation (e.g., the asynchronous core) may then be wrapped with boundary elements so that the external interface to the circuit remains unchanged. Thus, the activity of block 479 may include adding a synchronous wrapper to the asynchronous core.

In this manner, the asynchronous circuit design representation can include synchronous input signals and synchronous output signals. Permitting the use of both synchronous and asynchronous portions can provide additional benefits to certain ASIC designs, among others. For example, multiple asynchronous cores can be embedded within a single synchronous device.

The activity of block 479 may also include conversion via generating annotations to translate performance characteristics of the asynchronous circuit design representation into the synchronous domain to validate timing characteristics of the asynchronous circuit design representation. The activity of block 479 may also include storing the asynchronous circuit design representation as instructions to be used to fabricate one or more ASICs. Of course, the representation may also be stored in a dataflow graph format, if desired.

In some embodiments, the method 461 may include adjusting circuit performance at block 481. If not, then the method 461 may proceed to block 489. Otherwise, in some embodiments, the method 461 may include adding connection elements (CEs) to the asynchronous circuit design representation to increase average throughput performance of the asynchronous circuit design representation at block 485.

Those of ordinary skill in the art will realize that CEs can be added for many different reasons. For example, implementing a connection path that has had several CEs inserted permits several data tokens to be 'in flight' at the same time. In addition, where there are many levels of logic, a CE inserted between two logic levels can be used to permit one data token to pass through the first half of the level while another passes through the second half of the level, increasing throughput. Sometimes the insertion of CEs is known as using "transparent pipeline stages," since the benefit of pipelined processing can often be gained without adding delays for new data tokens.

The activity of block 485 may also include adding CEs to the asynchronous circuit design representation to balance path timing between asynchronous components. In some cases, CEs can be added in the 'short' path of reconvergent paths to balance path performance, allowing the resultant configuration to run at a higher rate.

The method 461 may go on to block 489 with generating an asynchronous netlist from the asynchronous circuit design representation. In some embodiments, the asynchronous netlist may be configured for implementation on an ASIC. Thus, the method 461 may include fabricating an ASIC based on the asynchronous circuit design representation at block 491, and conclude at block 495.

Those of ordinary skill in the art will realize that some of the method elements shown in FIG. 4 may be added to or substituted for any of the method elements shown in FIG. 1. Additionally, those of ordinary skill in the art will also realize that each of the method elements of both FIGS. 1 and 4 may be combined with the others in a variety of ways, to form a variety of methods that use the elements from each of the figures in serial, parallel, looped, and/or repetitious fashion. Many other embodiments may be realized.

Figure 5:
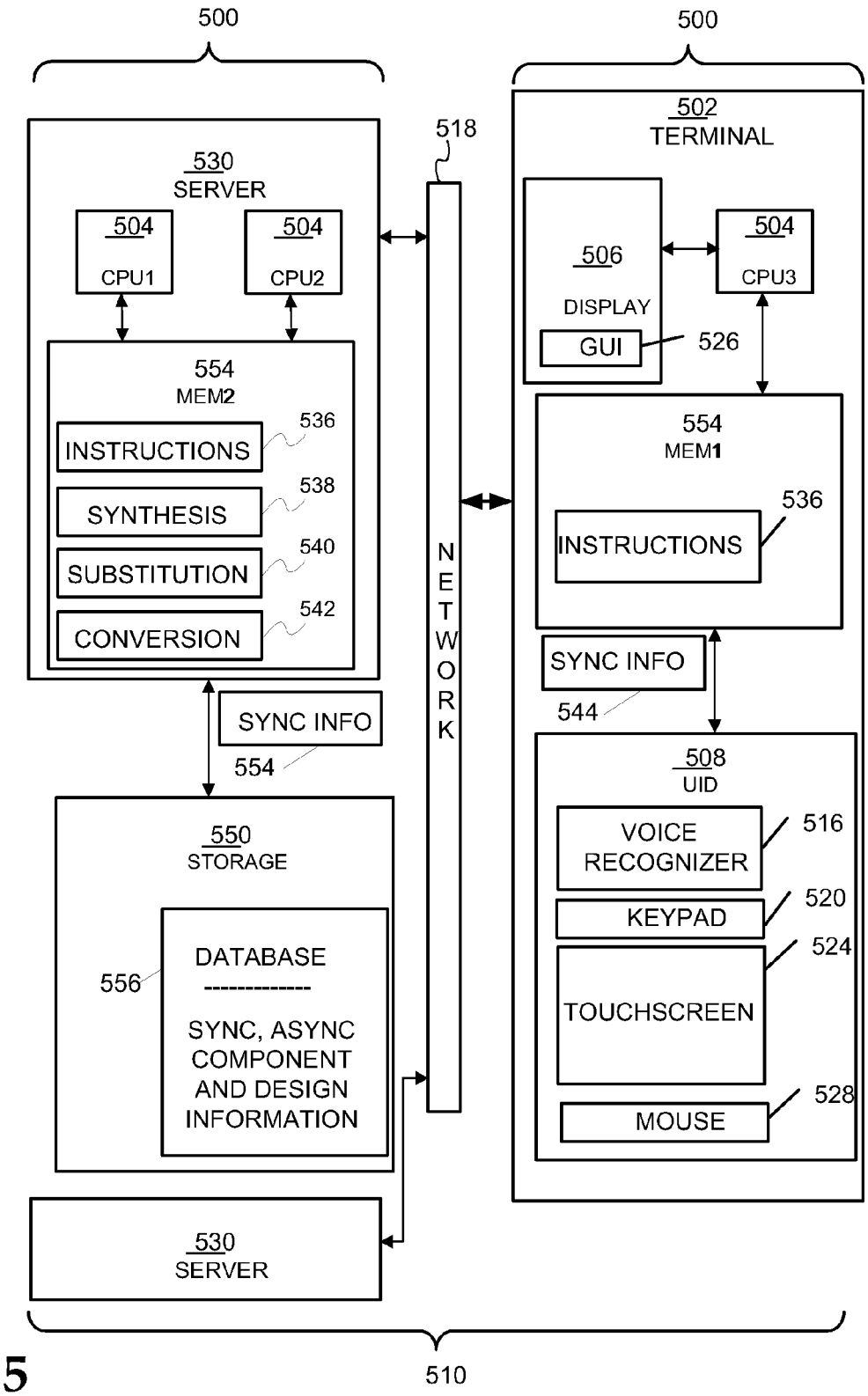
FIG. 5 is a block diagram of apparatus and systems used in conjunction with the conversion of synchronous logic to asynchronous logic according to various embodiments of the invention.

For example, FIG. 5 is a block diagram of apparatus 500 and systems 510 used in conjunction with the conversion of synchronous logic to asynchronous logic according to various embodiments of the invention. The apparatus 500 and systems 510 can be implemented in a machine-accessible and readable medium that is operational over one or more networks (e.g., the network 518, such as a local area network (LAN) and/or wide area network (WAN)). The network 518 may be wired, wireless, or a combination of wired and wireless. The apparatus 500 and systems 510 implement, among other things, the processing associated with the methods 111 and 461 of FIGS. 1 and 4, respectively.

The apparatus 500 may comprise many devices, such as a terminal 502, a server 530, a generic computer, and other devices with computational capability. The apparatus 500 may include one or more processors 504 coupled to a memory 554.

The apparatus 500 may include one or more user input devices 508, perhaps used to generate synchronous design information 544. The user input devices 508 may comprise one or more of a voice recognizer 516, a keyboard or keypad 520, a touch screen 524, or a mouse 528. The display 506 and/or the touch screen 524 may be used to display one or more GUIs 526. The GUI 526 may be used to display or otherwise present synchronous design descriptions, asynchronous design descriptions, standard synchronous and asynchronous design library components for automatic substitution, and other information.

One or more of the processors 504, as well as synthesis modules 538, substitution modules, 540, and conversion modules 542 may be included in a single server 530. The apparatus 500 may include one or more storage devices 550 to store a data structure 556 (e.g., a database of synchronous and/or asynchronous design information, perhaps including standard library component cell data) that includes a variety of information.

Synchronous design information 544 may be received from the user interface device 508, from a memory 554 in the form of instructions, from the database 556, and in a number of other ways known to those of ordinary skill in the art. The information 544 may be supplied unilaterally, or in response to a request originating from the server 530 (e.g., as part of a programmatic invitation), or the terminal 502 (e.g., as part of a designer's request to enter the information so that an asynchronous design can be formulated).

A system 510 that enables conversion of synchronous to asynchronous logic designs using automatic substitution of standard cell libraries may include one or more of the apparatus 500, such as one or more terminals 502, and one or more servers 530. The terminals 502 may take the form of a desktop computer, a laptop computer, a cellular telephone, a point of sale (POS) terminal, and other devices that can be coupled to the servers 530 via a network 518. Terminals 502 may include one or more processors 504, and memory 554. The network 518 may comprise a wired network, a wireless network, a local area network (LAN), or a network of larger scope, such as a global computer network (e.g., the Internet). Thus, the terminal 502 may comprise a wireless terminal. Each of the servers 530 and terminals 502 may be used as a source of synchronous design information 554. Therefore, many embodiments may be realized.

For example, in some embodiments a system to convert a portion of a synchronous circuit design to an asynchronous design comprises a computer, such as the server 530, and a synthesis tool module 538 to couple to the computer and to generate a synchronous netlist from the synchronous circuit design representation, perhaps derived from the synchronous design information 544. The system 510 also includes a substitution module 540 to automatically substitute asynchronous components taken from an asynchronous standard cell component library for corresponding standard cell synchronous components in the synchronous netlist to form an asynchronous core, and a conversion module 542 to convert the synchronous netlist to an asynchronous circuit design representation.

The system 510 may include a user terminal 502 to couple to the computer and to present a GUI 526 to receive an identification of the synchronous circuit design representation (e.g., some or all of the synchronous design information 544). For example, the terminal 502 may comprise an ASIC design terminal. The system 510 also includes a storage device 550 to couple to the computer and to store the synchronous circuit design representation, perhaps in a database 556.

Modules 538, 540, and 542 may comprise hardware, software, and firmware, or any combination of these. Thus, for example, some embodiments may include a machine-readable medium (e.g., memory 554) comprising instructions 536, which when executed by one or more processors 504, cause the processors 504 to perform any of the methods described herein, and/or illustrated in FIGS. 1 and 4.

Implementing the apparatus, systems, and methods described herein may thus permit the use of existing synthesis tools, aided by automated substitution, to assist in synthesizing synchronous logic descriptions into asynchronous logic implementations. Those that are less-skilled in asynchronous design may now be able to rapidly transform synchronous designs into equivalent asynchronous designs, reaping their attendant benefits. For example, some synchronous FPGA designs can be transformed into ASIC designs with superior speed, and/or higher density. Existing foundries and IC design companies may also be able to enjoy these benefits by taking synchronous designs and directly implementing them using standard ASIC cell libraries.

Embodiments of the invention can therefore be implemented in a variety of architectural platforms, operating and server systems, devices, systems, or applications. Any particular architectural layout or implementation presented herein is thus provided for purposes of illustration and comprehension only, and is not intended to limit the various embodiments.

This Detailed Description is illustrative, and not restrictive. Many other embodiments will be apparent to those of ordinary skill in the art upon reviewing this disclosure. The scope of embodiments should therefore be determined with reference to the appended claims, along with the full scope of equivalents to which such claims are entitled.

The Abstract of the Disclosure is provided to comply with 37 C.F.R. §1.72(b) and will allow the reader to quickly ascertain the nature of the technical disclosure. It is submitted with the understanding that it will not be used to interpret or limit the scope or meaning of the claims.

In this Detailed Description of various embodiments, a number of features are grouped together in a single embodiment for the purpose of streamlining the disclosure. This method of disclosure is not to be interpreted as an implication that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A computer-implemented method, comprising:
   generating a synchronous netlist from a synchronous circuit design representation comprising multiple clock domains;
   automatically substituting, using a computer, asynchronous components taken from an asynchronous standard cell component library for corresponding standard cell synchronous components in the synchronous netlist to form an asynchronous core; and
   converting the synchronous netlist to an asynchronous circuit design representation, including determining a repeating period that corresponds to a least common multiple of all clock cycle times associated with the multiple clock domains.

2. The computer-implemented method of claim 1, wherein the synchronous netlist is formatted according to an electronic design interface format.

3. The computer-implemented method of claim 1, wherein the synchronous circuit design representation is expressed using a hardware description language.

4. The computer-implemented method of claim 1, wherein automatically substituting comprises:
   mapping pin connections of the asynchronous components to pin connections of the standard cell synchronous components.

5. The computer-implemented method of claim 1, wherein automatically substituting comprises:
   replacing a state-holding element comprising one of the standard cell synchronous components with one of a communication link or an initial token element.

6. The computer-implemented method of claim 1, wherein automatically substituting comprises:
   replacing a register comprising one of the standard cell synchronous components with an initial token element associated with a connection element.

7. The computer-implemented method of claim 1, comprising:

adding synchronous to asynchronous conversion cells to the synchronous netlist, the synchronous to asynchronous conversion cells to receive signals entering the asynchronous core.

8. The computer-implemented method of claim 1, comprising:
adding asynchronous to synchronous conversion cells to the synchronous netlist, the asynchronous to synchronous conversion cells to transmit signals leaving the asynchronous core.

9. The computer-implemented method of claim 1, wherein the asynchronous circuit design representation comprises:
one of a dataflow graph, a description of a dataflow graph, or a high-level language.

10. The computer-implemented method of claim 1, comprising:
expressing the asynchronous circuit design representation as a dataflow model implemented with dual-rail data encoding and a single acknowledge.

11. The computer-implemented method of 1, wherein the asynchronous circuit design representation comprises:
a dataflow graph including at least one of tokens to represent data, a function block, a source block, a sink block, a copy block, a merge block, or an initial block.

12. The computer-implemented method of claim 1, wherein the asynchronous circuit design representation includes synchronous input signals and synchronous output signals.

13. The computer-implemented method of claim 1, wherein the converting comprises:
generating annotations to translate performance characteristics of the asynchronous circuit design representation into a synchronous domain to validate timing characteristics of the asynchronous circuit design representation.

14. The computer-implemented method of claim 1, comprising:
generating an asynchronous netlist from the asynchronous circuit design representation, the asynchronous netlist configured for implementation on an application-specific integrated circuit.

15. The computer-implemented method of claim 1, comprising:
fabricating an application-specific integrated circuit based on the asynchronous circuit design representation.

16. The computer-implemented method of claim 1, comprising:
adding connection elements to the asynchronous circuit design representation to increase average throughput performance of the asynchronous circuit design representation.

17. The computer-implemented method of claim 1, comprising:
adding connection elements to the asynchronous circuit design representation to balance path timing between the asynchronous components.

18. A system, comprising:
a computer;
a synthesis tool module to couple to the computer and to generate a synchronous netlist from the synchronous circuit design representation comprising multiple clock domains;
a substitution module to automatically substitute asynchronous components taken from an asynchronous standard cell component library for corresponding standard cell synchronous components in the synchronous netlist to form an asynchronous core; and
a conversion module to convert the synchronous netlist to an asynchronous circuit design representation, including determining a repeating period that corresponds to a least common multiple of all clock cycle times associated with the multiple clock domains.

19. The system of claim 18, comprising:
a user terminal to couple to the computer and to present a graphical user interface to receive an identification of the synchronous circuit design representation.

20. The system of claim 18, comprising:
a storage device to couple to the computer and to store the synchronous circuit design representation.

21. A machine-readable medium comprising instructions, which when executed by one or more processors, cause the one or more processors to perform the following operations:
generate a synchronous netlist from a synchronous circuit design representation comprising multiple clock domains;
automatically substitute asynchronous components taken from an asynchronous standard cell component library for corresponding standard cell synchronous components in the synchronous netlist to form an asynchronous core; and
convert the synchronous netlist to an asynchronous circuit design representation, including determining a repeating period that corresponds to a least common multiple of all clock cycle times associated with the multiple clock domains.

22. The machine-readable medium of claim 21, wherein the instructions, when executed by the one or more processors, cause the one or more processors to perform the following operations:
store the asynchronous circuit design representation as instructions to be used to fabricate an application-specific integrated circuit.

23. The machine-readable medium of claim 21, wherein the instructions, when executed by the one or more processors, cause the one or more processors to perform the following operations:
add a synchronous wrapper to the asynchronous core.

* * * * *

UNITED STATES PATENT AND TRADEMARK OFFICE
CERTIFICATE OF CORRECTION

PATENT NO. : 7,739,628 B2  Page 1 of 1
APPLICATION NO. : 12/031992
DATED : June 15, 2010
INVENTOR(S) : Rajit Manohar et al.

It is certified that error appears in the above-identified patent and that said Letters Patent is hereby corrected as shown below:

In column 5, line 67, delete "FIG. 2)are" and insert -- FIG. 2) are --, therefor.

In column 6, line 2, delete "308.For" and insert -- 308. For --, therefor.

In column 6, line 2, delete "CLK,every" and insert -- CLK, every --, therefor.

In column 6, line 7, delete "value" and insert -- values --, therefor.

In column 7, lines 11-12, delete "data flow" and insert -- dataflow --, therefor.

In column 7, line 18, delete "data flow" and insert -- dataflow --, therefor.

In column 11, line 20, in Claim 11, delete "1," and insert -- claim 1, --, therefor.

Signed and Sealed this

Fourteenth Day of September, 2010

David J. Kappos
*Director of the United States Patent and Trademark Office*